US006660630B1

(12) United States Patent
Chang et al.

(10) Patent No.: US 6,660,630 B1
(45) Date of Patent: Dec. 9, 2003

(54) METHOD FOR FORMING A TAPERED DUAL DAMASCENE VIA PORTION WITH IMPROVED PERFORMANCE

(75) Inventors: Chih-Fu Chang, Chiai (TW); Yu-Chun Huang, Hualien (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/268,511

(22) Filed: Oct. 10, 2002

(51) Int. Cl.[7] .......................................... H01L 21/4763
(52) U.S. Cl. ..................... 438/637; 438/638; 438/640; 438/700; 438/701
(58) Field of Search ................. 438/634, 637, 438/638, 640, 666, 668, 700–701, 712–713, 738

(56) References Cited

U.S. PATENT DOCUMENTS 4,560,436 A * 12/1985 Bukhman et al. ........... 438/701
6,261,947 B1 * 7/2001 McTeer ...................... 438/637
6,274,457 B1 * 8/2001 Sakai et al. ................. 438/701
6,482,733 B2 * 11/2002 Raaijmakers et al. ....... 438/637

\* cited by examiner

Primary Examiner—John F. Niebling
Assistant Examiner—Lynne A. Gurley
(74) Attorney, Agent, or Firm—Tung & Associates

(57) ABSTRACT

A method for selectively anisotropically a semiconductor feature to form a tapered sidewall profile including providing a semiconductor wafer including an anisotropically etched feature formed in at least one dielectric insulating layer including a relatively larger width dimension portion overlying and encompassing at least one relatively smaller diameter dimension portion the smaller diameter dimension portion further including a bottom portion including an overlying liner; and, selectively anisotropically etching the anisotropically etched feature according to a reactive ion etching (RIE) process to form a tapered sidewall portion of the at least one relatively smaller diameter portion.

20 Claims, 2 Drawing Sheets

METHOD FOR FORMING A TAPERED DUAL DAMASCENE VIA PORTION WITH IMPROVED PERFORMANCE

FIELD OF THE INVENTION

This invention generally relates to multi-layered semiconductor structures and more particularly to a method for forming a dual damascene structure with improved electrical performance including electromigration resistance and improved metal filling characteristics.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly where submicron inter-layer interconnects and intra-layer interconnects have increasingly high aspect ratios (e.g., an interconnect opening depth to diameter ratio of greater than about 4). In particular, high aspect ratio vias require uniform etching profiles including preventing necking or narrowing of the via opening which detrimentally affects design constraints for electrical resistance in semiconductor device functioning. Such necking or narrowing of the opening can detrimentally affect subsequent processes including adhesion/barrier layer deposition and metal filling deposition frequently resulting in degraded device function including electrical pathway open circuits.

In the fabrication of semiconductor devices, increased device density requires multiple layers, making necessary the provision of a multi-layered interconnect structure. Such a multi-layered interconnect structure typically includes intra-layer conductive interconnects and inter-layer conductive interconnects formed by anisotropically etched openings in an insulating layer, often referred to as inter-metal dielectric (IMD) layers, which are subsequently filled with metal. Commonly used inter-layer high aspect ratio openings are commonly referred to as vias, for example, when the opening extends through an insulating layer between two conductive layers. The intra-layer interconnects extending horizontally in the IMD layer to interconnect different areas within an IMD layer are often referred to as trench lines. In one manufacturing approach, trench lines are formed overlying and encompassing one or more vias to form metal inlaid interconnects referred to as dual damascene structures.

In a typical process for forming multiple layer interconnect structure, for example, a dual damascene process, a first IMD layer is deposited over an etching stop layer overlying a conductive area, for example a metallization layer. A second etching stop layer is formed over the first IMD layer followed by a second IMD layer formed over the second etching stop layer. In one approach to forming a dual damascene structure, via openings are first anisotropically etched through the first and second IMD layers by conventional photolithographic and etching techniques. A second anisotropically etched opening referred to as a trench line is then formed according to a second photolithographic patterning process overlying and encompassing one or more of the via openings. The via openings and the trench line together makeup the dual damascene structure which is subsequently filled with metal, for example, copper, followed by a CMP planarization process to planarize the wafer process surface and prepare the process surface for formation of another overlying layer or level in a multi-layered semiconductor device.

As feature sizes in anisotropic etching process have diminished, photolithographic patterning processes require activating light (radiation) of increasingly smaller wavelength. For 0.25 micron and below CMOS technology, deep ultraviolet (DUV) photoresists have become necessary to achieve the desired resolution. Typically DUV photoresists are activated with activating light source wavelengths of less than about 250 nm, for example, commonly used wavelengths include 193 nm and 248 nm. Many DUV photoresists are chemically amplified using a photoacid generator activated by the light source to make an exposed area soluble in the development process.

One problem affecting DUV photoresist processes is believed to be interference of residual nitrogen-containing species, for example amines, with the DUV photoresist. Residual nitrogen-containing contamination is one of the greater concerns in the use of metal nitride layers such as silicon nitride (e.g., SiN), which are commonly used as an etching stop layer. The silicon nitride layers are frequently formed by CVD processes using amine and amide containing precursors which tend to contaminate the near surface region of IMD layers. Low-k IMD layers, typically having a high degree of porosity, facilitate absorption and transport of contaminating chemical species. For example, it is believed that nitrogen radicals, created during photolithographic patterning due to the presence of nitrogen containing species and absorbed into the IMD layer during metal nitride deposition, interfere with chemically amplified DUV photoresists by neutralizing a photo generated acid catalyst which thereby renders the contaminated-portion of the photoresist insoluble in the developer. As a result, residual photoresist remains on patterned feature edges, sidewalls, or floors of features, detrimentally affecting subsequent anisotropic etching profiles. During anisotropic etching of an overlying feature, for example a trench line opening overlying a via opening, residual photoresist remains or is redeposited on feature opening sidewalls. Consequently, necking, narrowing, or other undesirable etching profiles caused by polymeric residues remaining on feature sidewalls or floors following anisotropic etching, detrimentally affecting subsequent metal filling processes and leading to, for example, electrical open circuits or increased resistivity of interconnect features.

For example, referring to FIG. 1, is shown a dual damascene structure at a stage in manufacturing formed by a typical via-first dual damascene process, where the via opening 20A is first formed followed by forming a trench line opening 20B overlying and encompassing the via opening 20A. The dual damascene structure including the via opening 20A and the trench line opening 20B are formed over an underlying conductive area 12. The dual damascene structure is typically formed by at least two photolithographic patterning and reactive ion etching processes including first forming a via opening 20A followed by a forming the trench line opening 20B including anisotropically etching through a series of layers including for example a bottom anti-reflectance coating (BARC) layer 18; a second dielectric insulating layer 16B; a second etching stop layer 14B; a first dielectric insulating layer 16A; and finally, through a thickness portion of first etching stop layer 14A. The first etching stop layer 14A is subsequently etched through to reveal the underlying conductive area 12.

As previously discussed, a serious problem with prior art processes for forming the dual damascene structure including forming the trench line opening according to an RIE process, is the formation of polymeric residues on feature sidewalls and floors, including what is referred to as a 'via fence' remaining at the trench line bottom portion e.g., 20C, surrounding the via opening 20A. The prior art methods for anisotropic trench etching and dual damascene formation have attempted to achieve substantially vertical sidewall profiles for both the via portion and the trench line portion in an effort to minimize the amount of surface area used by such structures. The presence of an etching stop layer at the trench line/via level helps achieve the goal of substantially vertical via sidewall profiles. One problem with the prior art method for anisotropically etching dual damascene structures including those having an etching stop layer at the trench line/via level is the tendency for polymer deposition around the via opening at the trench line/via level to form via fences detrimentally affecting both resistivity and electromigration resistance.

There is therefore a need in the semiconductor processing art to develop a method to reliably anisotropically etch dual damascene structures to avoid via fences and having improved electrical performance.

It is therefore an object of the invention to provide a method to reliably anisotropically etch dual damascene structures to avoid via fences and having improved electrical performance while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for selectively anisotropically a semiconductor feature to form a tapered sidewall profile.

In a first embodiment, the method includes providing a semiconductor wafer including an anisotropically etched feature formed in at least one dielectric insulating layer including a relatively larger width dimension portion overlying and encompassing at least one relatively smaller diameter dimension portion the smaller diameter dimension portion further including a bottom portion including an overlying liner; and, selectively anisotropically etching the anisotropically etched feature according to a reactive ion etching (RIE) process to form a tapered sidewall portion of the at least one relatively smaller diameter portion.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference the formation of a via-first method of formation of a dual damascene structure in a multi-level semiconductor device, it will be appreciated that the method of the present invention is equally applicable to the anisotropic etching of other structures where one anisotropically etched opening is formed overlying and at least partially encompassing one or more other anisotropically etched openings where the problem of photoresist or polymeric residue deposition remaining on features following a photolithographic patterning process and/or an anisotropic etching process is advantageously prevented by subjecting the features to the anisotropic etching process according to the present invention. While the method of the present invention is explained with exemplary reference to the formation of a copper filled dual damascene structure, it will be appreciated that the method is applicable where other metals, for example tungsten, aluminum, copper, or alloys thereof, are used to fill the dual damascene structure including the use of various types of adhesion/barrier liners.

Figure 1:
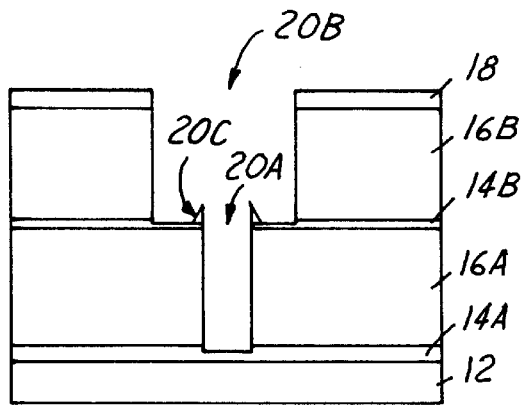
FIG. 1 is an exemplary cross sectional view of a dual damascene structure at a stage in manufacturing according to the prior art.

For example, in an exemplary embodiment, referring to FIGS. 2A–2F, are shown cross sectional side views of a portion of a multi-level semiconductor device at stages in a dual damascene manufacturing process. Referring to FIG. 1A is shown a conductive region 21, for example, copper, formed in a dielectric insulating layer (not shown) having an overlying first etching stop layer 22A, for example, silicon nitride (e.g., SiN). First etching stop layer 22A is formed by a conventional chemical vapor deposition (CVD) process including for example, LPCVD (low pressure CVD), having a thickness of about 300 Angstroms to about 700 Angstroms.

Figure 2A:
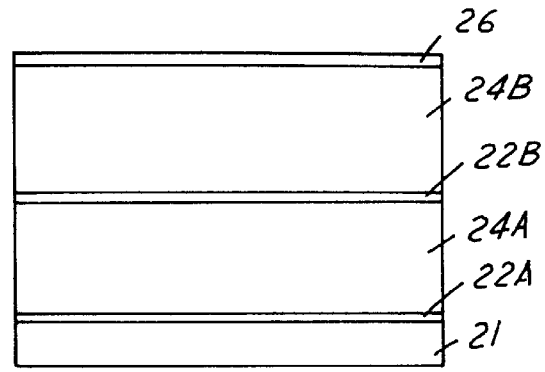
FIGS. 2A–2E are exemplary cross sectional views of a dual damascene structure at stages in a manufacturing process according to an embodiment of the present invention.

Still referring to FIG. 2A, formed over etching stop layer 22A is first dielectric insulating layer 24A, also referred to as an inter-metal dielectric (IMD) layer formed of, for example, fluorinated silicate glass (FSG) or a low-k (low dielectric constant) silicon oxide based material, e.g., carbon doped silicon dioxide, preferably having a dielectric constant of less than about 3.5. Typically, the first IMD layer is formed having a thickness of about 3000 to about 7000 Angstroms.

Still referring to FIG. 2A, following deposition of the first IMD layer 24A, a second etching stop layer 22B is formed in a similar manner to first etching stop layer 22A, formed of, for example, silicon nitride (e.g., SiN) by an LPCVD process, having a thickness of about 300 Angstroms to about 600 Angstroms. Formed over second etching stop layer 22B is a second IMD layer 24B, also formed of, for example, fluorinated silicate glass (FSG) or a low-k (low dielectric constant) silicon oxide based material, e.g., carbon doped silicon dioxide, preferably having a dielectric constant of less than about 3.5. Typically, the second IMD layer is formed having a thickness about the same or slightly less than the first IMD layer. Formed over the second IMD layer 24B is a bottom anti-reflectance coating (BARC) layer 26 to reduce undesired light reflections from the second IMD layer surface during a photolithographic patterning process. For example, the BARC is formed of silicon oxynitride (e.g., SiON) in an LPCVD process to a thickness of about 1000 to about 1400 Angstroms.

Figure 2B:
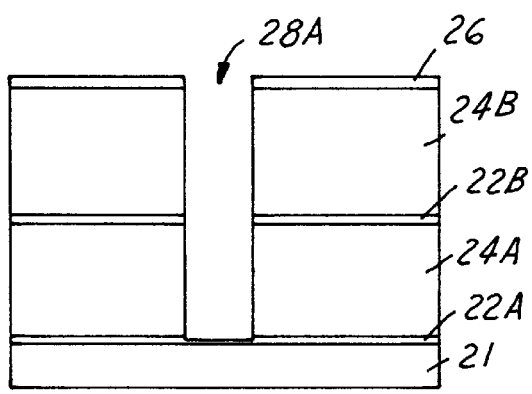

Referring to FIG. 2B, a via etching pattern is first formed according to a conventional photolithographic patterning process followed by a conventional reactive ion etching (RIE) step to form via opening 28A. For example the anisotropic etching step includes sequential etching steps including conventional plasma etching chemistries formed of combinations of gases including hydrofluorocarbons, fluorocarbons, nitrogen, and oxygen to sequentially etch through a thickness of the BARC layer 26, the second IMD layer 24B, the second etching stop layer 22B, the first IMD layer 24A, and partially through a thickness of the first etching stop layer 22A.

Figure 2C:
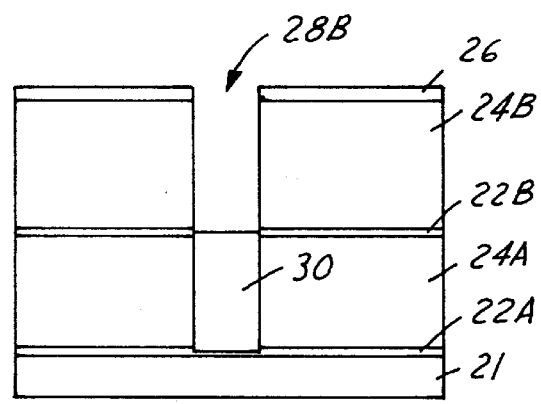

Referring to FIG. 2C, following anisotropically etching via opening 28A, a resinous material layer, such as an I-line photoresist, or novolac (novolak) resin optionally including photoactive sensitizer such as diazonapthoquinone, is blanket deposited by a spin-coating process to fill via opening 28A followed a thermal and/or ultraviolet radiative curing process to initiate further polymeric cross linking reactions and/or to drive off solvents. For example, the thermal curing process is carried out from about 90° C. to about 140° C. and the radiative curing process is carried out with ultraviolet light including wavelengths of less than about 400 nm. A plasma etching chemistry including oxygen is then used to etchback the resinous material layer to form via plug 30 filling at least a portion of via opening 28A. Preferably, the resinous layer is etched back such that the via plug is formed to fill the via to a level about where a subsequently formed overlying trench line depth reaches the via portion level, for example, at about the second etching stop layer 22B. The via plug 30 serves to protect via sidewalls during a subsequent trench line etching process and provides an etching endpoint detection means for the trench line etching process.

Figure 2D:
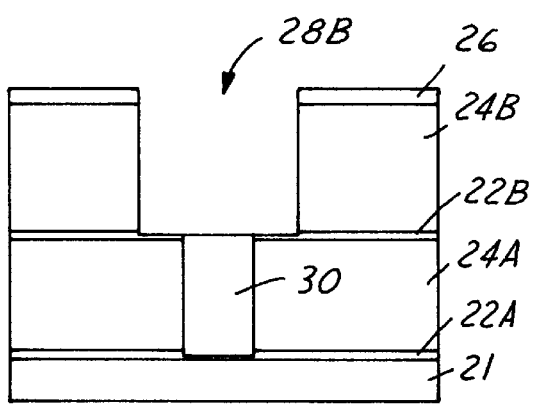

Referring to FIG. 2D, a second conventional photolithographic patterning process is then carried out to pattern a trench line opening etching pattern overlying and encompassing via opening 28A. It will be appreciated that the trench line opening may encompass more than one via opening. A conventional RIE process is then carried out to anisotropically etch trench opening 28B overlying and encompassing via opening 28A including partially etching through the second etching stop layer 22B. Following the trench etching process, a remaining portion of via plug 30 is removed according to a conventional oxygen containing plasma ashing treatment to substantially remove via plug 30 and polymeric residues remaining within the dual damascene opening.

Figure 2E:
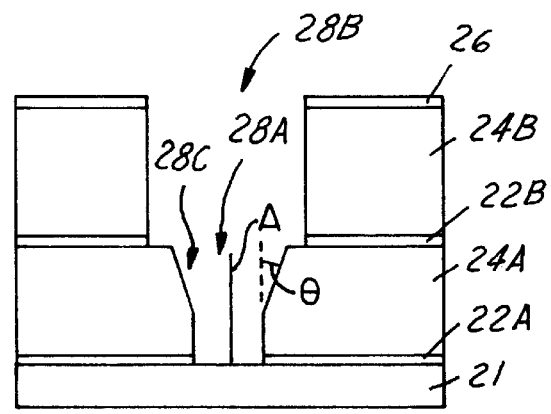

Referring to FIG. 2E, following removal of the via plug 30, according to the present invention a selective anisotropic etching process having an etching selectivity of silicon dioxide (e.g., IMD layer) to silicon nitride (e.g., etching stop layer 22B and 22A) of greater than about 10 to 1 is carried out to selectively etch through a remaining portion of etching stop layer 22A to reveal the underlying conductive area 21 and to form a tapered via opening sidewall portion e.g., 28C in remaining via opening portion 28A. In other words, the etching rate of the IMD layer is greater by about a factor of 10 compared to the etching rate of the etching stop layers 22A and 22B. It will be appreciated that at least a portion of remaining portion the etching stop layer 22B is also removed. Preferably, the tapered via opening sidewall portion forms a via opening diameter adjacent the trench line opening level that is greater in diameter compared to a bottom portion adjacent etching stop layer 22A by about 25 percent to about 100 percent. Preferably, the tapered portion of the via portion opening sidewall extends from the via opening adjacent the trench line level a distance from about 25 percent to about 100 percent of the via opening portion e.g., 28A depth. For example, in one embodiment, the tapered portion of the via opening sidewall forms an angle theta of about 60 degrees to about 85 degrees with respect to a vertical line e.g., A, centered within the via opening. It will be appreciated that some vias may be formed having a sidewall portion substantially aligned with the overlying trench line, in which case, only the sidewall portion of the via opening portion not aligned with the trench line sidewall will be tapered forming in cross section a one sided or asymmetrically tapered via opening (not shown).

For example, in a preferable embodiment, the selective anisotropic etching process includes plasma operating conditions including a plasma reactor operating pressure of about 30 milliTorr to about 70 milliTorr; an RF power of about 1200 to about 1600 Watts; plasma source gas flow rates of about 5 to about 15 sccm of $C_4F_8$; 100 to about 300 sccm of CO; and about 200 to about 600 sccm of argon; and a plasma etching period of about 5 seconds to about 15 seconds.

Following the selective anisotropic etching process an oxygen containing plasma treatment is carried out to clean any remaining polymeric residues from the dual damascene structure and to adjust the tapered profile of the via portion e.g., 28A sidewalls according to the preferred embodiments.

Preferably, the oxygen containing plasma treatment includes a plasma formed from a plasma source gas oxygen mixture having a volume composition ratio of nitrogen to oxygen of about 1:1 to about 10:1 respectively, the volume composition ratios indicating a relative volume composition of nitrogen to oxygen with respect to the total volume of the plasma source gas mixture. For example, as will be appreciated, the preferred volume composition ratios may be achieved by adjusting the relative source gas feed rates to the plasma reactor of individually supplied oxygen and nitrogen to correspond to the volume composition ratios of additive gas to oxygen of about 1 to 1 to about 10 to 1, respectively.

Exemplary plasma processing conditions for the oxygen containing plasma treatment include a plasma reactor chamber pressure of about 1 milliTorr to about 50 milliTorr, more preferably about 15 milliTorr to about 30 milliTorr. An RF power is preferably supplied to form and maintain the plasma between about 50 Watts to about 500 Watts. The oxygen containing plasma treatment is carried out for a period of about 10 seconds to about 60 seconds at a temperature of about 0° C. to about 80° C., more preferably from about 10° C. to about 60° C.

It has been found, according to exemplary embodiments of the present invention that the tapered via opening portion has no detrimental effect on electrical performance, rather electrical performance is comparable to the electrical performance of substantially vertical vias having no polymer residue defects. Various process wafer performance testing and benchmarks assessed following exemplary implementation of the present invention in a 0.13 micron process showed results well within acceptable parameters. Advantageously, electro-migration resistance was determined to be improved compared to prior art method of dual damascene formation. In addition, the coverage of barrier/adhesion layer deposition, for example, tantalum nitride was found to be improved, believed to be due to improved transport to the surface of reactants. In addition, for similar reasons, the coverage of a copper seed layer by PVD was found to have improved coverage and an improved electrodeposition metal filling process filling the dual damascene structure with a void free copper layer. For example, process wafer performance testing and benchmarks well known in the art including electro-migration (EM) wafer acceptance testing (WAT), and yield were well within acceptable parameters or had improved performance following exemplary implementation of the present invention.

Although not shown, the dual damascene structure is then completed according to conventional processes. For example, the dual damascene opening is filled with metal, for example, a copper filling according to an electrodeposition process followed by a CMP process to remove excess copper above the trench opening to complete the formation of a dual damascene. Prior to electrodeposition of copper, a barrier/adhesion layer of for example, tantalum nitride, is blanket deposited to line the dual damascene structure, followed by deposition of a copper seed layer to provide an electrodeposition surface. During the subsequent CMP process the process surface is planarized above the trench line opening to complete the formation of the dual damascene structure.

Figure 3:
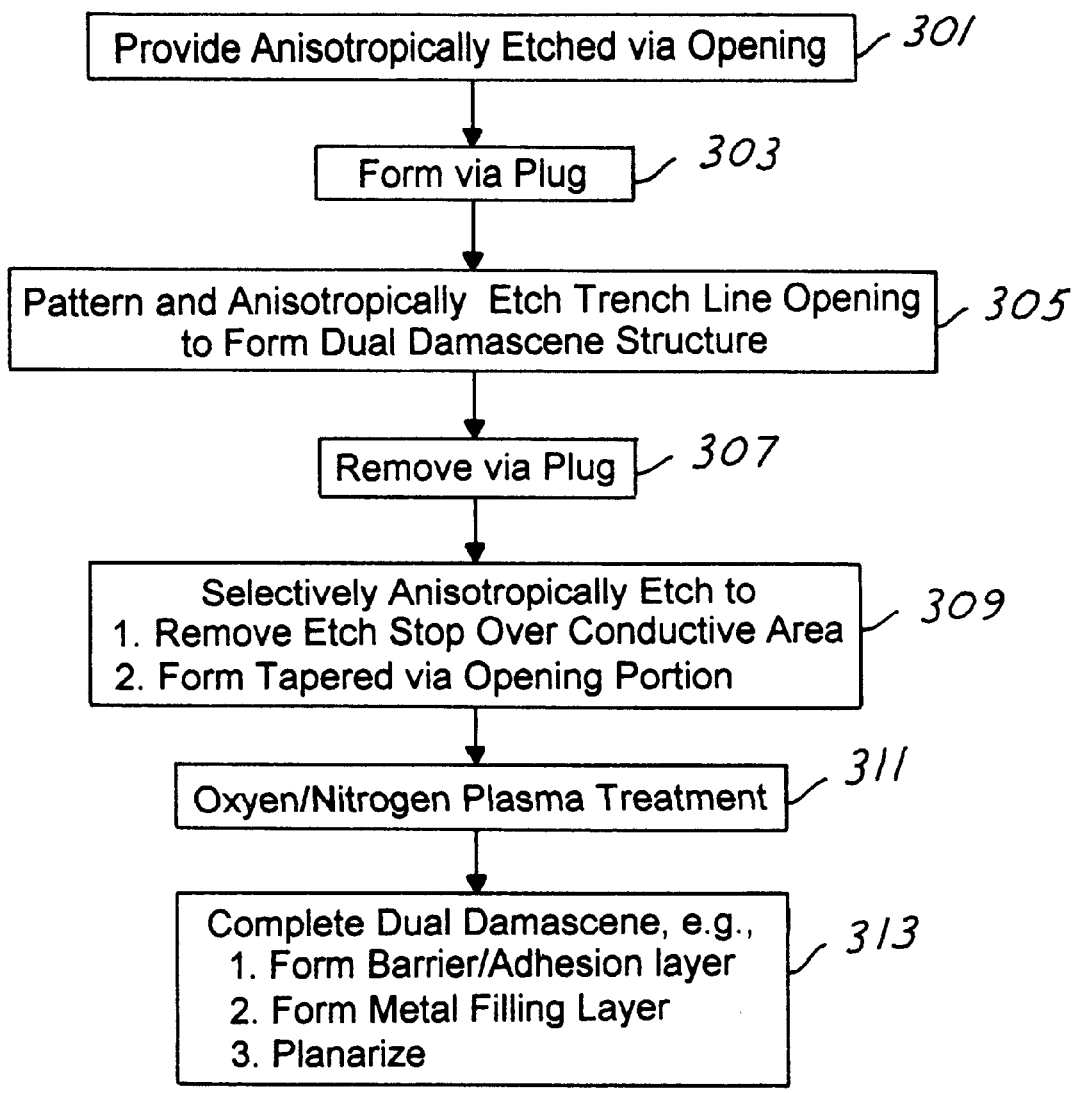
FIG. 3 is a process flow diagram including several embodiments of the present invention.

Referring to FIG. 3 is shown a process flow diagram including several embodiments of the present invention. In process 301, a semiconductor wafer comprising a via opening is provided. In process 303, a polymeric via plug is formed to at least partially fill the via opening. In process 305, a photolithographic patterning and anisotropic etching process is carried out to form a trench line opening overlying and encompassing the via opening to form a dual damascene structure. In process 307 the via plug is removed by an oxygen ashing process. In process 309 a selective anisotropic etching process according to the present inventions is carried out having an etching selectivity of silicon oxide to silicon nitride of greater than about 10 to 1 to etch through a remaining portion of a via bottom portion etching stop layer while forming a tapered portion of the via opening sidewall profile. In process 311 an oxygen/nitrogen containing plasma treatment is carried out to remove remaining polymeric residue and to adjust the tapered via opening sidewall profile according to preferred embodiments. In process 313, a several conventional processes are carried out to complete the dual damascene including a barrier/adhesion layer deposition step, a metal filling deposition step and a planarization process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for selectively anisotropically etching a semiconductor feature to form a tapered sidewall profile comprising the steps of:
   providing a semiconductor wafer comprising an anisotropically etched feature formed in at least one dielectric insulating layer comprising a relatively larger width dimension portion overlying and encompassing at least one relatively smaller diameter dimension portion the smaller diameter dimension portion further comprising a bottom portion including an overlying liner; and,
   selectively anisotropically etching the anisotropically etched feature according to a reactive ion etching (RIE) process to form a tapered sidewall portion of the at least one relatively smaller diameter portion.

2. The method of claim 1, wherein the RIE process comprises an etching rate of the dielectric insulating layer being greater by about a factor of 10 compared to an etching rate of the liner.

3. The method of claim 1, wherein the at least one dielectric insulating layer comprises silicon dioxide.

4. The method of claim 1, wherein the liner comprises a metal nitride.

5. The method of claim 4, wherein the liner comprises silicon nitride.

6. The method of claim 5, wherein the RIE process comprises an operating pressure of about 30 milliTorr to about 70 milliTorr.

7. The method of claim 6, wherein the RIE process comprises plasma operating conditions including an RF power of about 1200 to about 1600 Watts and plasma source gas flow rates of about 5 sccm to about 15 sccm of $C_4F_8$; about 100 sccm to about 300 sccm of CO; and, about 200 sccm to about 600 sccm of argon.

8. The method of claim 7, wherein the RIE process is performed for a period of about 5 seconds to about 15 seconds.

9. The method of claim 1, wherein the tapered sidewall portion comprises an opening diameter about 25 percent to about 100 percent larger compared to a diameter of the bottom portion.

10. The method of claim 9, wherein the tapered sidewall portion comprises from about 25 percent to about 75 percent of the relatively smaller diameter portion depth.

11. The method of claim 1, wherein the tapered sidewall portion comprises an angle theta for about 60 degrees to about 85 degrees with respect to a vertical line centered within the relatively smaller diameter portion.

12. The method of claim 1, further comprising an oxygen plasma treatment carried out following the step of selectively anisotropically etching to adjust at least one a tapered sidewall angle and a tapered sidewall length of the tapered sidewall portion.

13. The method of claim 12, wherein the oxygen plasma treatment comprises forming an oxygen containing plasma from a plasma source gas comprising a volumetric ratio of nitrogen to oxygen of about 1 to 1 to about 10 to 1 with respect to the total volume of the plasma source gas.

14. A method for selectively anisotropically etching a dual damascene opening to form a tapered via portion sidewall having an improved electrical performance comprising the steps of:
   providing a semiconductor wafer comprising a via opening portion and a trench line portion to form a dual damascene opening extending through at least one silicon dioxide containing dielectric insulating layer the via opening portion comprising a metal nitride liner covering a bottom portion of the via opening; and,
   selectively anisotropically etching the dual damascene opening according to a reactive ion etching (RIE) process comprising removing the metal nitride liner to form a tapered sidewall portion within the via opening portion the tapered sidewall portion comprising an upper portion adjacent the trench line portion relatively larger in diameter compared to the bottom portion diameter.

15. The method of claim 14, wherein the RIE process comprises an etching rate of the at least one silicon dioxide containing dielectric insulating layer being greater by about a factor of 10 compared to an etching rate of the metal nitride liner.

16. The method of claim 15, wherein the metal nitride liner comprises silicon nitride.

17. The method of claim 6, wherein the RIE process comprises plasma operating conditions including an operating pressure of about 30 milliTorr to about 70 milliTorr; an RF power of about 1200 to about 1600 Watts and plasma source gas flow rates of about 5 sccm to about 15 sccm of $C_4F_8$; about 100 sccm to about 300 sccm of CO; and, about 200 sccm to about 600 sccm of argon.

18. The method of claim 1, wherein the upper portion comprises a relatively larger diameter larger by about 25 percent to about 100 percent compared to the bottom portion diameter.

19. The method of claim 9, wherein the tapered sidewall portion comprises from about 25 percent to about 75 percent of the via opening portion depth.

20. The method of claim 1, further comprising a plasma treatment carried out following the step of selectively anisotropically etching to adjust at least one a tapered sidewall portion taper angle and a tapered sidewall portion taper length of the tapered sidewall portion.

* * * * *